US012757678B2

(12) United States Patent
Horio et al.

(10) Patent No.: US 12,757,678 B2
(45) Date of Patent: Oct. 6, 2026

(54) PACKAGING UNIT AND TRANSPORTATION CONTAINER

(71) Applicant: SUMCO CORPORATION, Tokyo (JP)

(72) Inventors: Tomohiro Horio, Tokyo (JP); Takayuki Kihara, Tokyo (JP); Shinji Kanda, Tokyo (JP); Keiichi Takanashi, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 21 days.

(21) Appl. No.: 18/860,075

(22) PCT Filed: Jan. 23, 2023

(86) PCT No.: PCT/JP2023/001925
§ 371 (c)(1),
(2) Date: Oct. 25, 2024

(87) PCT Pub. No.: WO2023/210078
PCT Pub. Date: Nov. 2, 2023

(65) Prior Publication Data

US 2025/0157839 A1 May 15, 2025

(30) Foreign Application Priority Data

Apr. 27, 2022 (JP) ................................ 2022-073268

(51) Int. Cl.
*H10P 72/10* (2026.01)
*B65D 81/107* (2006.01)

(52) U.S. Cl.
CPC ........ *H10P 72/1922* (2026.01); *B65D 81/107* (2013.01)

(58) Field of Classification Search
CPC .. H10P 72/1922; H10P 72/10; H10P 72/1912; B65D 81/107; B65D 77/04; B65D 81/05; B65D 81/113; B65D 85/30
See application file for complete search history.

(56) References Cited

U.S. PATENT DOCUMENTS 5,575,394 A * 11/1996 Nyseth .............. H01L 21/67386 206/711
5,706,951 A * 1/1998 Oinuma ............ H01L 21/67396 206/592

(Continued)

FOREIGN PATENT DOCUMENTS

CN 208022088 U 10/2018
CN 109229707 A 1/2019

(Continued)

OTHER PUBLICATIONS

Office Action issued in Taiwan Counterpart Patent Appl. No. 112107224, dated Jan. 11, 2024, along with an English translation thereof.

(Continued)

*Primary Examiner* — Orlando E Aviles
*Assistant Examiner* — Jenine Spicer
(74) *Attorney, Agent, or Firm* — GREENBLUM & BERNSTEIN, P.L.C.

(57) ABSTRACT

A packaging unit includes a lower cushioning material; middle cushioning materials each one of which is interposed between storing objects in corresponding one of two rows in an upper deck and a lower deck; upper cushioning materials; and a vibration absorbing unit provided on a bottommost portion of a container. The vibration absorbing unit includes a first flat plate, a second flat plate, and elastic bodies. The center of each of the elastic bodies is outside a centroid of corresponding one of the storing objects with respect to the center of the two rows of the storing objects. A distance between the center of each of the elastic bodies and the centroid of corresponding one of the storing objects in the width direction is in a range from 2% to 8% of a maximum outer diameter of the elastic body.

9 Claims, 14 Drawing Sheets

(56) References Cited

U.S. PATENT DOCUMENTS

| | | | | |
|---|---|---|---|---|
| 5,875,896 | A * | 3/1999 | Liang ................ | H01L 21/67366 206/593 |
| 8,789,320 | B1 * | 7/2014 | Bradford ............... | E01D 19/041 52/167.6 |
| 10,403,527 | B2 * | 9/2019 | Nagashima ....... | H01L 21/67386 |
| 2007/0221102 | A1 | 9/2007 | Reinhall | |
| 2014/0227469 | A1 * | 8/2014 | Horio ................ | H01L 21/67369 428/36.5 |
| 2016/0196993 | A1 | 7/2016 | Nagashima | |
| 2016/0280443 | A1 | 9/2016 | Nagashima | |

FOREIGN PATENT DOCUMENTS

| | | | |
|---|---|---|---|
| FR | 2601655 | A1 | 1/1988 |
| JP | H09-39946 | A | 2/1997 |
| JP | 2011-16549 | A | 1/2011 |
| JP | 2015-209222 | A | 11/2015 |
| JP | 2018-107216 | A | 7/2018 |
| JP | 2019-6424 | A | 1/2019 |
| JP | 2019-55794 | A | 4/2019 |
| JP | 2020-93805 | A | 6/2020 |
| TW | 201515958 | A | 5/2015 |
| TW | 201518184 | A | 5/2015 |

OTHER PUBLICATIONS

International Search Report issued in WIPO Patent Application No. PCT/JP2023/001925, dated Apr. 4, 2023, along with an English translation thereof.

International Preliminary Report on Patentability for WIPO App. No. PCT/JP2023/001925, issued on Oct. 29, 2024.

Official Communication (Notice of Allowance including Search Report) received in Chinese Patent Application No. 202380036527.7 dated Jun. 3, 2026, which is received on Jun. 9, 2026, along with an English translation thereof.

* cited by examiner

VIBRATION STRENGTH IN X DIRECTION APPLIED
TO STORAGE CASE WHEN BEING VIBRATED IN Z DIRECTION

PACKAGING UNIT AND TRANSPORTATION CONTAINER

TECHNICAL FIELD

The present invention relates to a packaging unit for packing a storing object in a container, and a transportation container.

BACKGROUND ART

In accordance with increasingly strict demand for quality of semiconductor wafers in these days, there arises a growing concern over defects on semiconductor wafer, adhesion of a resin material used for wafer holders, and the like, which are caused due to vibrations and impacts during transportation.

As methods of transporting semiconductor wafers, a method has been known of preparing a plurality of storage cases that each store the semiconductor wafers, packing the plurality of storage cases in a container, and subsequently transporting the container using a transportation device.

In order to pack the storage cases in the container, it is known to use a unit (referred to as a "packaging unit" hereinafter) including a cushioning material interposed between the container and the storage cases and a vibration absorbing unit provided below the cushioning material. The cushioning material is mainly made of foamed polyurethane. Known examples of the vibration absorbing unit include a pair of plastic plates and a plurality of elastic bodies held between the pair of plastic plates.

The vibration absorbing unit is a unit for damping vibrations of the storage case during transportation by the elastic bodies. As an example, Patent Literature 1 discloses a unit including a pair of plates made of plastic cardboard and elastic bodies held between the plates of plastic cardboard.

CITATION LIST

Patent Literature(s)

Patent Literature 1: JP 2011-16549 A

SUMMARY OF THE INVENTION

Problem(s) to be Solved by the Invention

The elastic bodies of the vibration absorbing unit are elastically deformed to absorb vibrations and impacts. However, it sometimes occurs that the plastic plate is so greatly warped depending on positions of the elastic bodies that the storage cases are inclined and cushioning materials are in contact with each other.

When a large number of elastic bodies are provided, the warpage of the plastic plate can be restrained, but meanwhile absorption effects for vibrations and impacts are reduced, and therefore the number of elastic bodies has to be a bare minimum.

Especially, when the storage cases are stacked vertically over the other (i.e. in double deck) in the container, the storage cases placed in an upper deck disadvantageously are more inclined than the storage cases placed in a lower deck.

In addition, a gap between the cushioning material and the container is widened to reduce damping effect when some impact is applied during transportation.

An object of the invention is to provide a packaging unit for packing a storing object in a container and a transportation container including the container housing the packaging unit, in which inclination of the storing object can be restrained and the storing object and a cushioning material can be stably taken out.

Means for Solving the Problem(s)

A packaging unit according to an aspect of the invention is a packaging unit that packs storing objects into a box-shaped container, the storing objects being cases storing semiconductor wafers and being arranged in two rows spaced from each other in a width direction and in double deck in a vertical direction in the container, the packaging unit including: a lower cushioning material configured to support lower parts of the storing objects in the two rows in a lower deck; middle cushioning materials, each one of the middle cushioning materials being interposed between the storing objects in corresponding one of the two rows in an upper deck and the storing objects in corresponding one of the two rows in the lower deck; upper cushioning materials, each one of the upper cushioning materials being provided on the storing objects in corresponding one of the two rows in the upper deck and configured to hold upper parts of the storing objects in the corresponding one of the two rows; and a vibration absorbing unit provided on a bottommost portion of the container, the vibration absorbing unit being configured to support the lower cushioning material from below, in which the vibration absorbing unit includes: a first flat plate; a second flat plate provided below the first flat plate to be parallel to the first flat plate; and elastic bodies interposed between the first flat plate and the second flat plate, the number of the elastic bodies being the same as the number of the storing objects in each of the decks, and a center of each of the elastic bodies is outside a centroid of corresponding one of the storing objects with respect to a center of the two rows of the storing objects in planar view and a distance between the center of each of the elastic bodies and the centroid of the corresponding one of the storing objects in the width direction is in a range from 2% to 8% of a maximum outer diameter of each of the elastic bodies.

In the packaging unit of the above aspect, a ratio Gy/Gx of Gy to Gx may be in a range from 1 to 1.3, where Gx is a gap between centers of the elastic bodies adjoining in a row direction and Gy is a gap between centers of the elastic bodies adjoining in a width direction.

In the packaging unit of the above aspect, a bending strength of the first flat plate may be twice to thrice as large as a bending strength of the second flat plate.

In the packaging unit of the above aspect, a cut may be formed at least in the first flat plate, of the first flat plate and the second flat plate.

A transportation container according to another aspect of the invention includes: the packaging unit according to the above aspect; and a box-shaped container configured to house the packaging unit.

DESCRIPTION OF EMBODIMENT(S)

Figure 1:
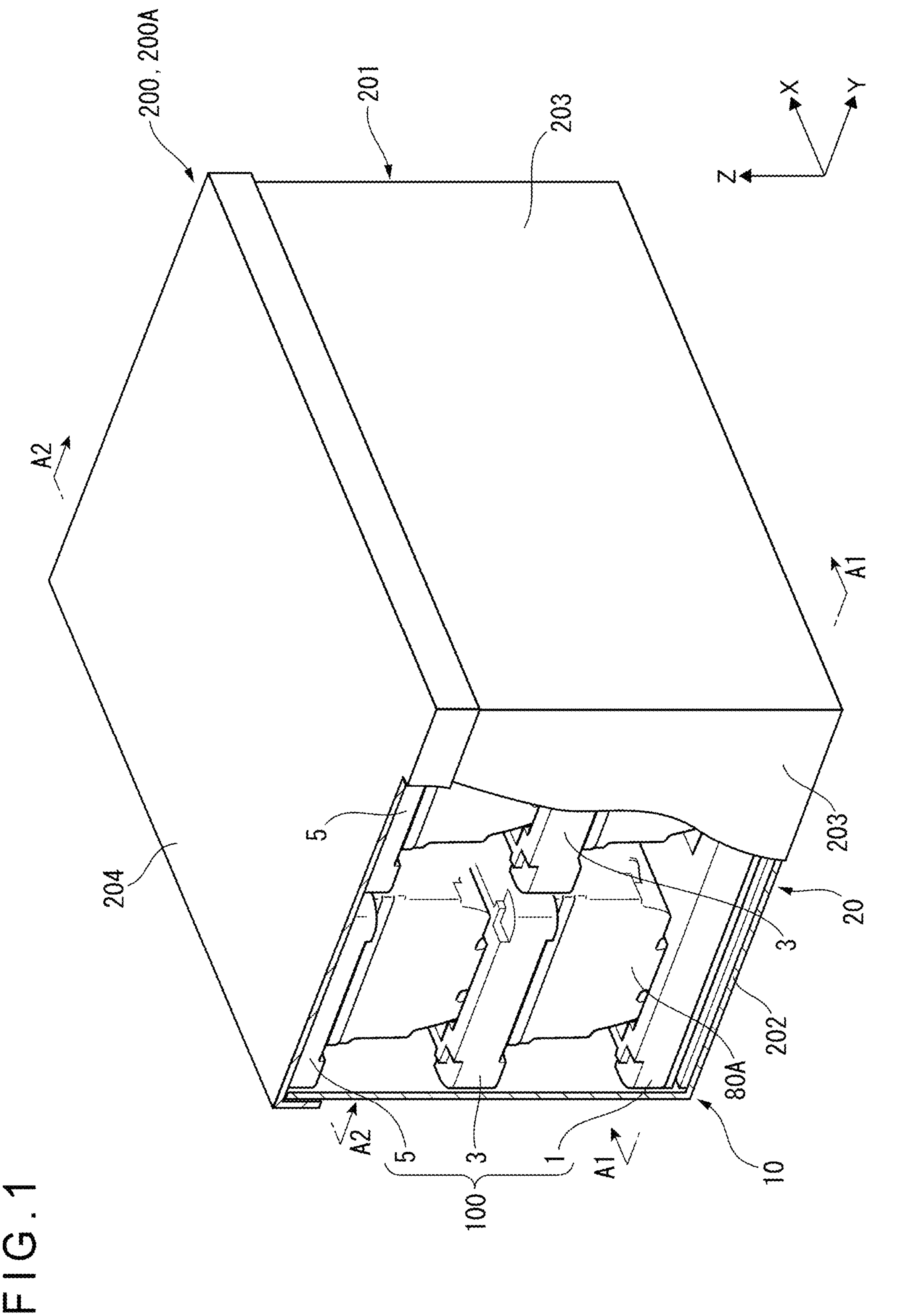
FIG. 1 is a perspective view illustrating a packed state where storage cases and cushioning materials are arranged within a container.

Suitable exemplary embodiment(s) of the invention will be described in detail below with reference to the attached drawings.

A packaging unit 10 of the invention is a unit used for packing a plurality of storage cases 80 in a container 200. A configuration including the packaging unit 10 and the container 200 with a box shape housing the packaging unit 10 will be referred to as a transportation container 200A.

A plurality of semiconductor wafers W are stored in each of the storage cases 80. Hereinafter, the storage cases 80 storing the semiconductor wafers W will be referred to as storing objects 80A.

The packaging unit 10 includes a cushioning material group 100 including upper cushioning materials 5, middle cushioning materials 3 and a lower cushioning material 1, and a vibration absorbing unit 20 provided on a bottommost portion of the container 200 to support the lower cushioning material 1 from below.

The cushioning material group 100 is interposed between a plurality of the storing objects 80A and the container 200 when the storing objects 80A are packed in the container 200.

Initially, the container 200, in which a plurality of the storing objects 80A are packed, will be described below. As illustrated in FIG. 1, the container 200 is a box component that defines therein a rectangular parallelepiped housing space, in which a plurality of (twelve, in the exemplary embodiment) the storing objects 80A are packed together with the cushioning material group 100.

The container 200 includes a container body 201 with an open upper side and a container cover 204 that closes the upper side of the container body 201, and the container 200 has a box shape including the container body 201 and the container cover 204 in an entirety thereof. The container body 201 includes four side plates 203 that are mutually connected to define a rectangular hollow and a bottom plate 202 that closes a bottom portion. The container 200 can be made of a material capable of enduring transportation by a truck and the like, e.g. cardboard, plastic, metal such as aluminum, and/or wood.

Next, an arrangement of the cushioning material group 100 and the storing objects 80A will be described below.

Figure 2:
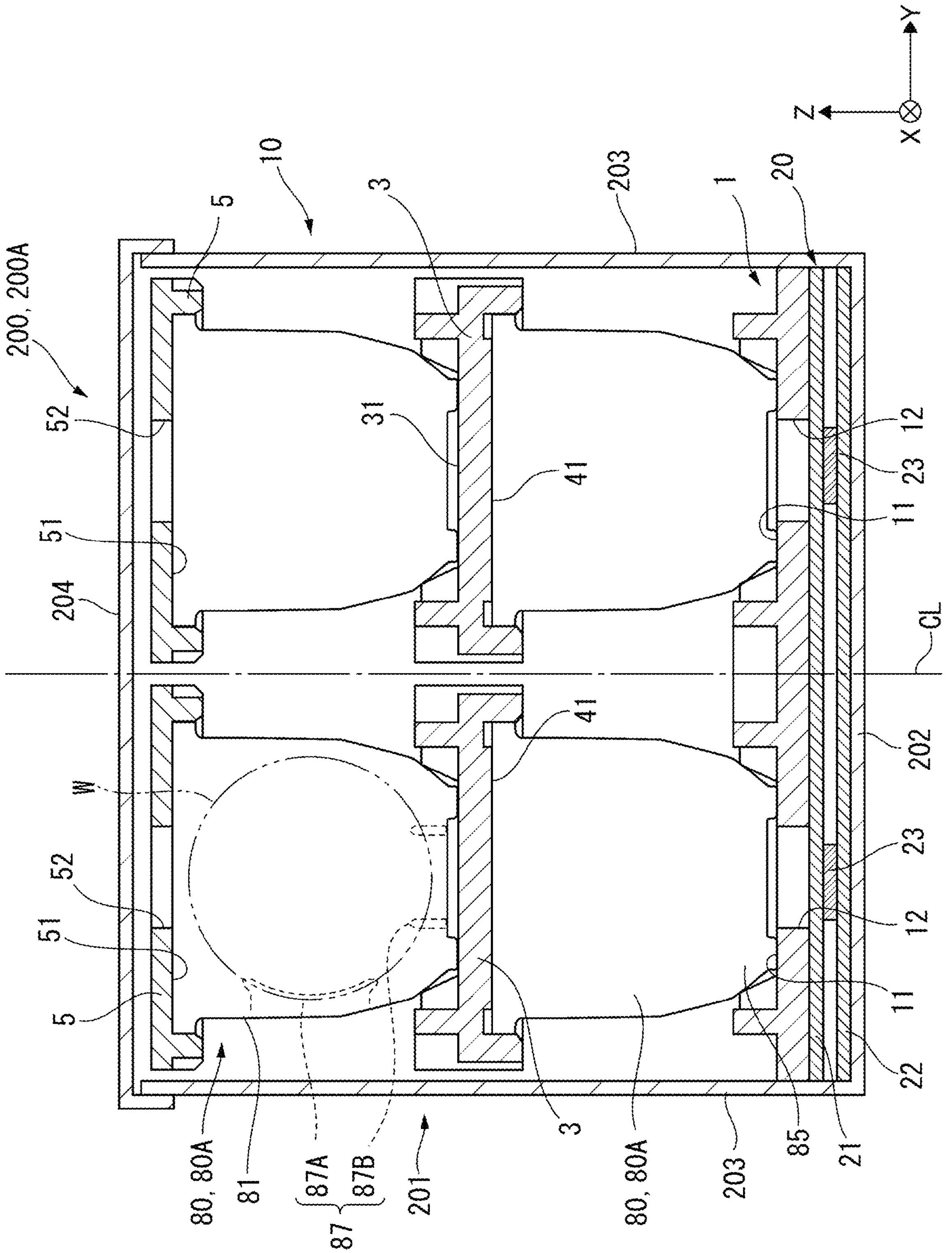
FIG. 2 is a cross-sectional view viewed in a direction indicated by A1-A1 in FIG. 1.
Figure 3:
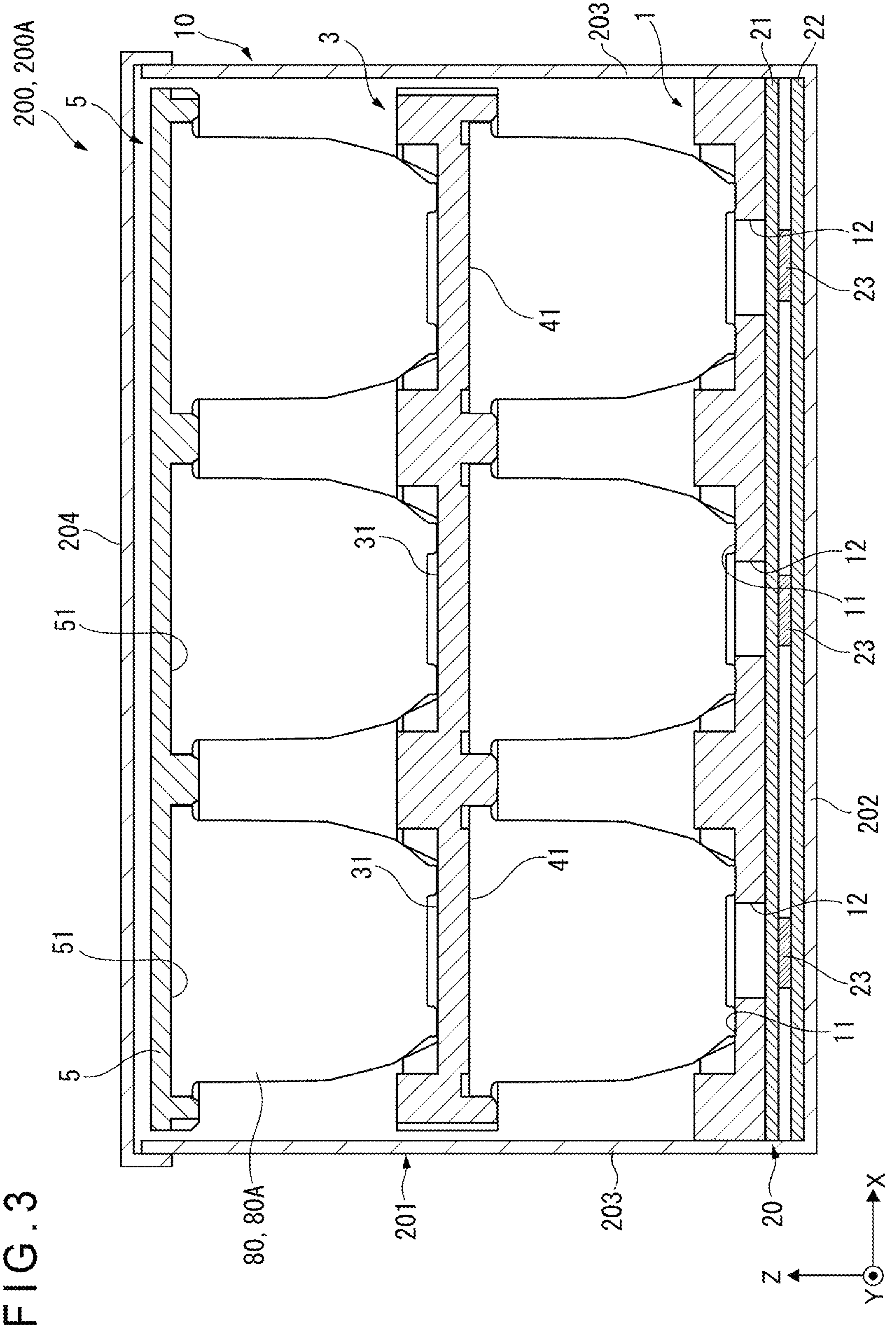
FIG. 3 is a cross-sectional view viewed in a direction indicated by A2-A2 in FIG. 1.

As illustrated in FIGS. 1 to 3, two rows, which are arranged in a horizontal direction and in each of which three storing objects 80A are aligned, are arranged in double deck in a vertical direction, and thus a total of twelve storing objects 80A are placed within the container 200. That is, the packaging unit 10 allows the storing objects 80A to be packed in the container 200 in two rows spaced apart from each other in a width direction and arranged in double deck in the vertical direction.

The number of the storing objects 80A in each of the rows of the storing objects 80A is not necessarily three. For instance, two rows of two storing objects 80A may be arranged in double deck in the vertical direction.

A direction for the row of the storing objects 80A to extend will be referred to as an X direction (row direction), a direction orthogonal to the X direction will be referred to as a Y direction (width direction), and the vertical direction will be referred to as a Z direction hereinbelow.

The cushioning material group 100 is used to absorb impact on the storing objects 80A arranged in two rows and in double deck. The cushioning material group 100 includes: one lower cushioning material 1 that supports lower parts of the storing objects 80A in the two rows in a lower deck; the middle cushioning materials 3 each one of which is interposed between the storing objects 80A in corresponding one of the rows in an upper deck and the storing objects in corresponding one of the rows in the lower deck; and the upper cushioning materials 5 each one of which is disposed on the storing objects 80A in corresponding one of the two rows in the upper deck and configured to hold upper parts of the storing objects 80A in the corresponding one of the two rows.

Hereinbelow, a state, where the twelve storing objects 80A, the two upper cushioning materials 5, the two middle cushioning materials 3 and the one lower cushioning material 1 are disposed in the container 200, will be referred to as a packed state.

Figure 4:
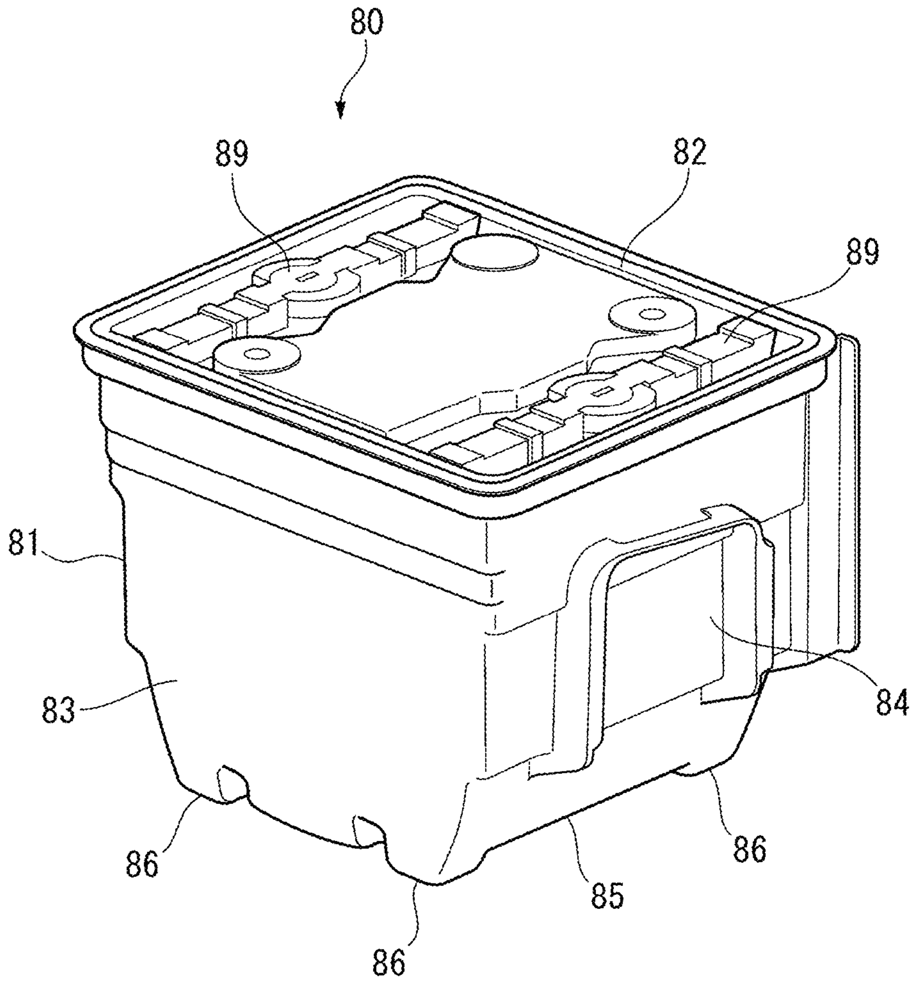
FIG. 4 is a perspective view of a storage case.

Next, the storage cases 80, which are each a member of the storing objects 80A, will be described below. Each of the storage cases 80 is a case for storing the semiconductor wafers W and, for instance, is in a form of FOSB (Front Opening Shipping Box). As illustrated in FIG. 4, each of the storage cases 80 includes a case body 81 having an open upper side and a case cover 82 that closes the upper side of the case body 81.

The case body 81 includes a pair of first walls 83, a pair of second walls 84 serving as side faces of the case body 81 together with the pair of first walls 83, and a bottom portion 85 that closes a lower side of the case body 81, the first walls 83, the second walls 84 and the bottom portion 85 being integrated.

The case body 81 includes a plurality of leg portions 86. The leg portions 86 are each a leg projecting downward from the bottom portion 85.

As illustrated in FIG. 2, a wafer holder 87 with a comb shape is provided in the case body 81 of the storage case 80. The wafer holder 87 is provided with holding slots for holding a plurality of the semiconductor wafers W spaced from each other.

The wafer holder 87 includes side holders 87A that are in contact with outer peripheries of side portions of the semiconductor wafers W, and bottom holders 87B that are in contact with outer peripheries of bottom portions of the semiconductor wafers W.

Two rows of the side holders 87A are each provided on corresponding one of mutually facing inner surfaces of the second walls 84. Two bottom holders 87B are directly provided on the bottom portion 85. Each of the two side holders 87A is arranged on corresponding one of the second walls 84 in parallel to each other in a direction for the slots to be arranged, i.e., in a direction orthogonal to the sheet of FIG. 2.

Figure 5A:
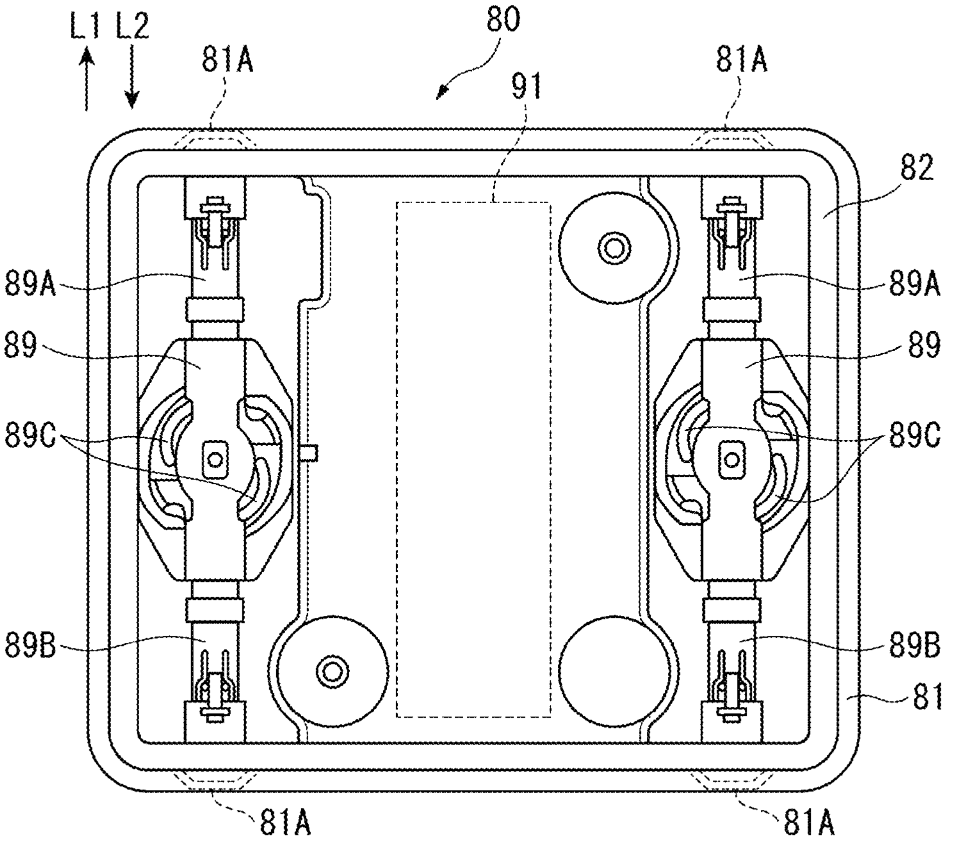
FIG. 5A is a top view of the storage case.
Figure 5B:
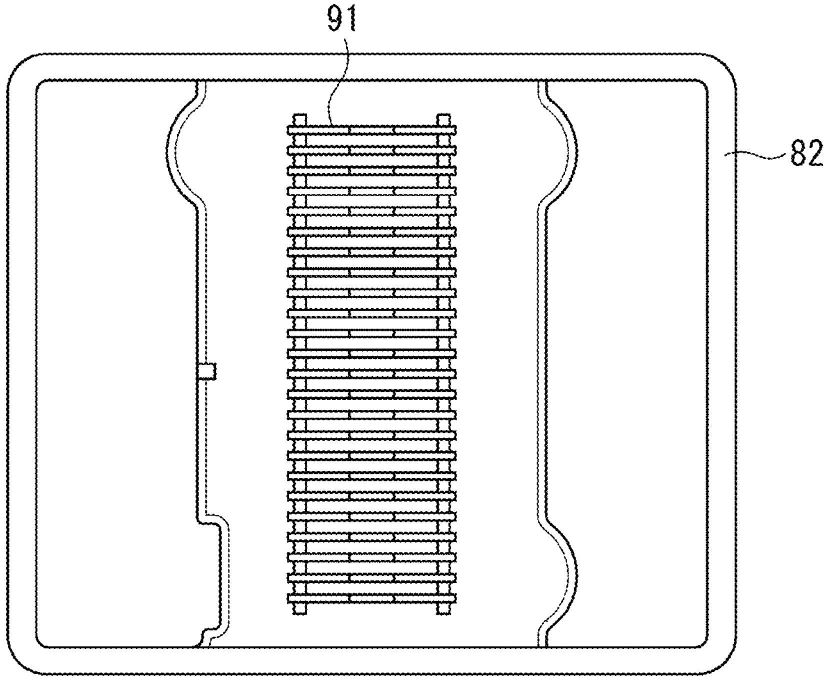
FIG. 5B is a view illustrating a back side of a case cover.

The case cover 82 is a plate component having a rectangular planar shape, and includes a pair of lock members 89 on a top side and a retainer 91 on a back (inner) side as illustrated in FIGS. 4, 5A, and 5B.

The lock members 89 are components for locking the case cover 82 with the case body 81, and each include lock bars 89A and 89B and a latch mechanism 89C as illustrated in FIG. 5A.

The lock bars 89A and 89B are components provided along mutually facing sides of the case cover 82, and are movable in directions indicated by L1 and L2 in FIG. 5A.

Rotation of the latch mechanism 89C causes movement of the lock bar 89A and the lock bar 89B in the L1 and L2 directions, respectively, via a cam mechanism. Ends of the lock bars 89A and 89B are thus brought into engagement with concaves 81A provided in the case body 81 to fix the case cover 82 to the case body 81. When the latch mechanism 89C is rotated back into original position while the case cover 82 is fixed on the case body 81, the lock bars 89A and 89B are pulled toward inside of the case cover 82 to unlock the case body 81.

As illustrated in FIG. 5B, the retainer 91 is an elongated comb-shaped component provided on the back side of the case cover 82, to be located between the lock members 89. By the upper peripheries of the semiconductor wafers W housed within the case body 81 being inserted between the teeth of the comb to be brought into contact with the teeth, the retainer 91 holds the semiconductor wafers W so as to restrict axial movement and/or circumferential rotation of the semiconductor wafers W and prevent the semiconductor wafers W from coming into contact with each other.

In FIG. 5B, the retainer 91 is provided at the center of the case cover 82 in parallel to a direction for the semiconductor wafers W to be arranged, so that the retainer 91 is parallel to at least one of the sides of the rectangle of the case cover 82.

Next, the cushioning materials 1, 3 and 5 of the cushioning material group 100 will be described below.

The cushioning materials 1, 3 and 5 are made of at least one of foamed polyurethane, foamed polyethylene, foamed polypropylene, or foamed polystyrene.

The lower cushioning material 1, which is a member of the cushioning material group 100, is a cushioning material for supporting the lower parts of the storing objects 80A in the rows in the lower deck.

The lower cushioning material 1 has a rectangular shape. The lower cushioning material 1 is sized to substantially cover an entire surface of the bottom plate 202 of the container 200. The lower cushioning material 1 includes six lower receivers 11 each for receiving a lower part of corresponding one of the storage cases 80. The lower receivers 11 are arranged in a matrix of 3 (in the X direction)×2 (in the Y direction).

The lower receivers 11 are parts each shaped so that the lower part of corresponding one of the storage cases 80 is fitted. Each of the lower receivers 11 is provided, at the center thereof, with a lower opening 12 that is a rectangular hole formed in a bottom of the lower cushioning material 1.

The upper cushioning materials 5, which are each a member of the cushioning material group 100, are cushioning materials for supporting upper parts of the storing objects 80A in the rows in the upper deck.

Each of the upper cushioning materials 5 has a rectangular shape. The upper cushioning materials 5 are used in a pair in the packed state, and are each configured to cover substantially half of the opening of the container 200.

Each of the upper cushioning materials 5 has three upper receivers 51. Each of the upper receivers 51 holds the case cover 82 of corresponding one of the storage cases 80.

As illustrated in FIGS. 1 and 2, the two upper cushioning materials 5 are housed within the container body 201 in parallel in the packed state.

Each of the upper receivers 51 is provided, at the center thereof, with an upper opening 52 that is a rectangular hole penetrating through each of the upper cushioning materials 5 from an upper side to a lower side thereof.

The middle cushioning materials 3 are each a cushioning material for holding upper parts of the storing objects 80A in corresponding one of the rows of the storing objects 80A in the lower deck, and also supporting lower parts of the storing objects 80A in corresponding one of the rows of the storing objects 80A in the upper deck.

Each of the middle cushioning materials 3 has a rectangular shape. As in the upper cushioning materials 5, the middle cushioning materials 3 are used in a pair in the packed state.

Three middle body receivers 31, which are similar to the lower receivers 11 of the lower cushioning material 1, are provided on an upper side of each of the middle cushioning materials 3 (i.e. a side facing upward in the packed state). Middle cover receivers 41, which are similar to the upper receivers 51 of each of the upper cushioning materials 5, are provided on a lower side of each of the middle cushioning materials 3 (i.e. a side facing downward in the packed state).

Positions of the storing objects 80A in the packed state are determined by the shape of the cushioning materials. The storing objects 80A are positioned symmetrically with respect to a centerline CL in the Y direction.

Next, the structure of the vibration absorbing unit 20 will be described below with reference to FIGS. 2 and 3.

The vibration absorbing unit 20 is a unit configured to absorb vibrations generated when the storing objects 80A are packed, and includes a first flat plate 21, a second flat plate 22, and a plurality of elastic bodies 23. The vibration absorbing unit 20 is provided between the lower cushioning material 1 and the bottom plate 202 of the container 200.

The first flat plate 21 and the second flat plate 22 are rectangular plate-shaped components that are slightly smaller in size than the bottom plate 202 of the container 200. The second flat plate 22 is provided on the bottom plate 202 of the container 200. The first flat plate 21 is provided above the second flat plate 22 via the plurality of elastic bodies 23.

The second flat plate 22 is provided below the first flat plate 21 to be parallel to the first flat plate 21. The elastic bodies 23 are interposed between the first flat plate 21 and the second flat plate 22.

The first flat plate 21 and the second flat plate 22 are preferably plastic plates whose thickness is in a range from 3 mm to 25 mm, more preferably in a range from 8 mm to 20 mm. The first flat plate 21 and the second flat plate 22 are preferably made of a plastic plate of a hollow structure such as plastic cardboard or the like. The first flat plate 21 and the second flat plate 22 are not necessarily made of plastic plates, and any other plate-shaped components that are lightweight and have excellent vibration absorptivity can be employed.

Figure 7:
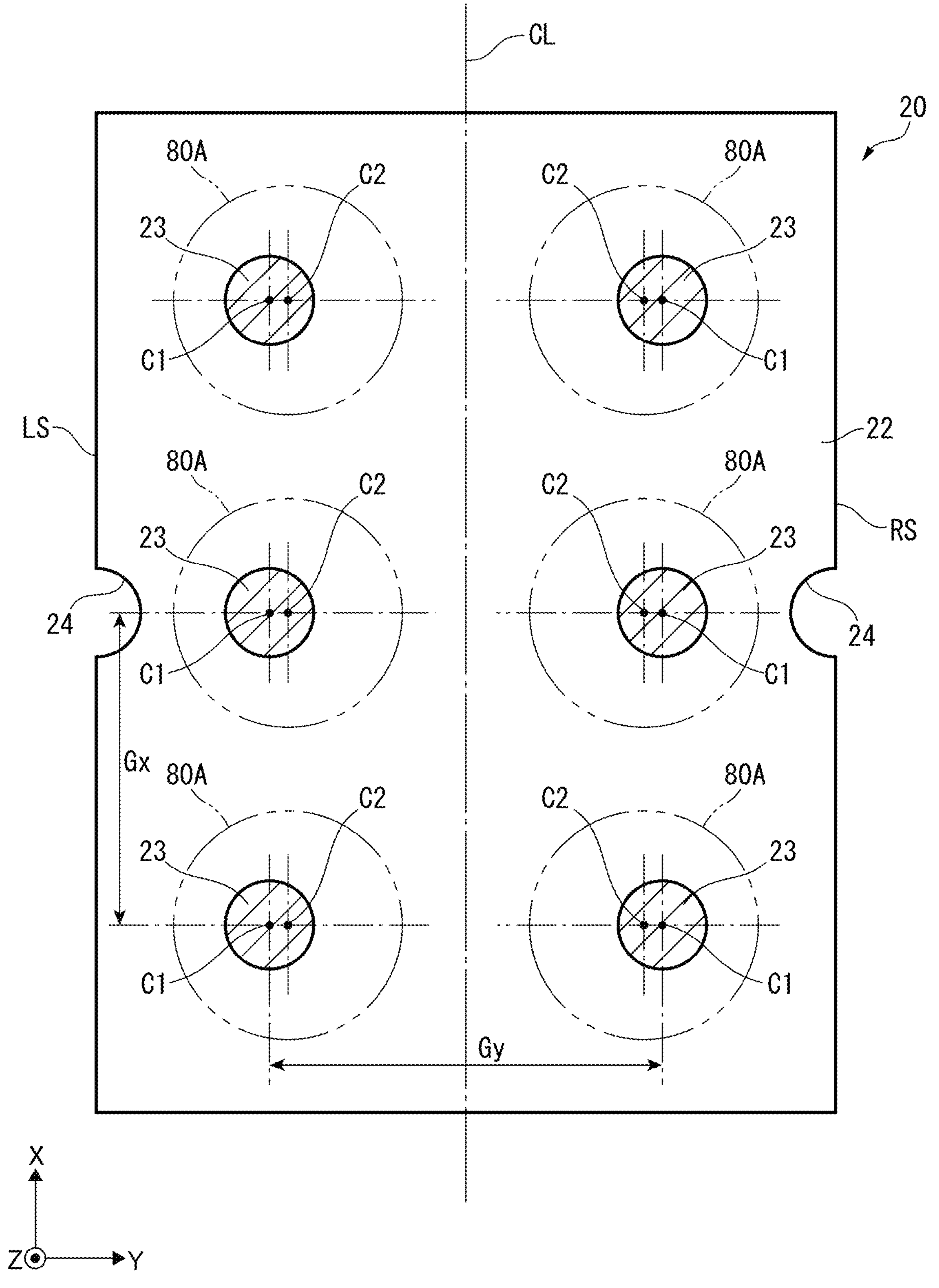
FIG. 7 is a plan view of the vibration absorbing unit according to the exemplary embodiment of the invention, which is viewed in a direction indicated by arrows VII-VII in FIG. 6.

As illustrated in FIG. 7, the first flat plate 21 and the second flat plate 22 are provided with cuts 24. The cuts 24 of the exemplary embodiment are formed in each of the long sides of the flat plates 21 and 22 substantially at the center in the X direction. The cuts 24 may be formed at the short sides of the flat plates 21 and 22. While the shape of the cuts 24 is preferably semicircular, the shape may be rectangular or the like.

It should be noted that, though the cuts 24 are formed in both of the first flat plate 21 and the second flat plate 22 in the exemplary embodiment, it is only necessary that the cuts 24 are formed at least in the first flat plate 21.

A bending strength of the first flat plate 21 is twice to thrice as large as a bending strength of the second flat plate 22.

The first flat plate 21 of the exemplary embodiment can be made of a plastic plate whose bending strength is in a range from 2 MPa to 8 MPa. The second flat plate 22 of the exemplary embodiment can be made of a plastic plate whose bending strength is in a range from 1 MPa to 4 MPa.

The first flat plate 21 and the second flat plate 22, which have the same thickness, have the different bending strengths by using plastic plates of different materials.

It should be noted that the first flat plate 21 may be made of a plastic plate of the same material as that of the second flat plate 22 but thicker than that of the second flat plate 22, in order to achieve the bending strength of the first flat plate 21 twice to thrice as large as the bending strength of the second flat plate 22.

The elastic bodies 23 are cylindrical components that elastically deform when being applied with vibrations to absorb the vibrations. A diameter of each of the elastic bodies 23 is in a range from 45 mm to 85 mm. A height of each of the elastic bodies 23 is in a range from 25 mm to 35 mm. While the elastic bodies 23 can be made of, for instance, polyurethane resin, synthetic rubber, polyethylene and/or the like, the elastic bodies 23 are preferably made of polyurethane resin.

Upper and lower sides of the elastic bodies 23 are bonded to the flat plates 21 and 22, respectively.

The number of the elastic bodies 23 is the same as the number (six) of the storing objects 80A in each of the decks.

Next, positions of the elastic bodies 23 will be described below in detail.

Figure 6:
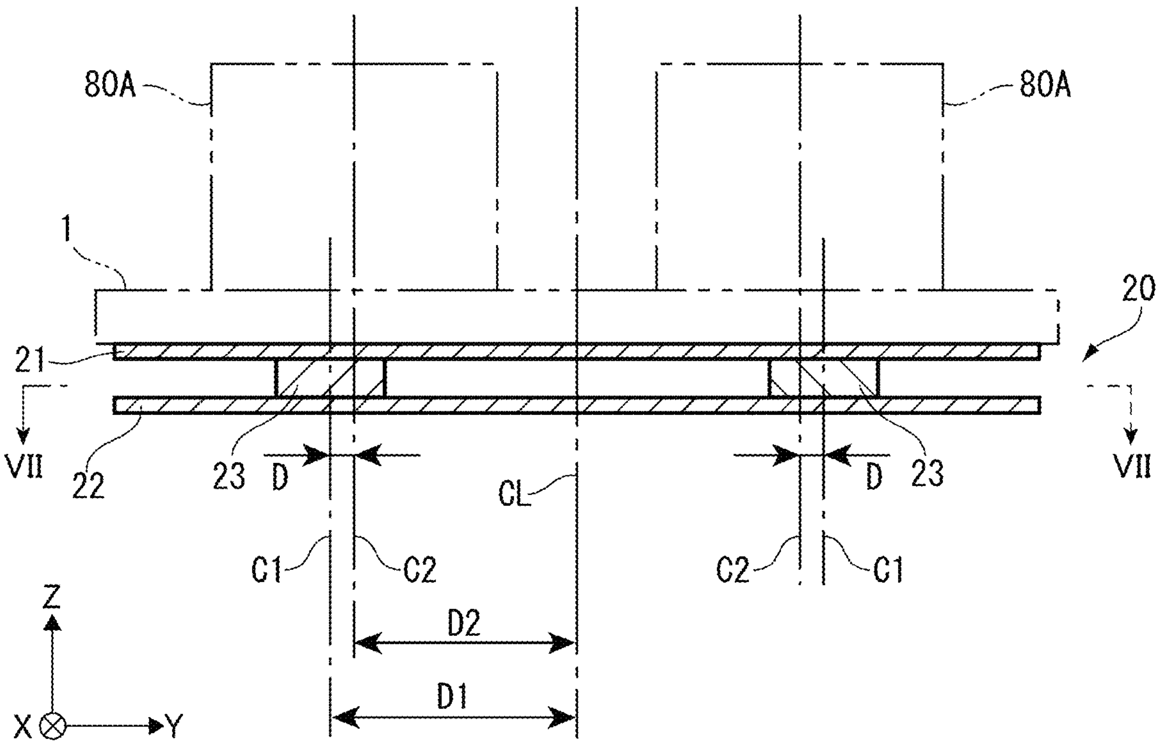
FIG. 6 is a cross-sectional view of a vibration absorbing unit according to an exemplary embodiment of the invention.

FIG. 6 is a cross-sectional view of the vibration absorbing unit 20. FIG. 7 is a plan view of the vibration absorbing unit. As illustrated in FIGS. 6 and 7, the elastic bodies 23 are located between a pair of the flat plates 21 and 22 at positions corresponding to the storing objects 80A (i.e. at substantially the same positions as those of the respectively corresponding storing objects 80A in planar view). That is, as in the storing objects 80A, the elastic bodies 23 are positioned symmetrically with respect to the centerline CL in the Y direction. A position of a center C1 of each of the elastic bodies 23 in the X direction is substantially the same as a position of a centroid C2 of corresponding one of the storing objects 80A in the X direction.

In planar view, a position of the center C1 of each of the elastic bodies 23 in the Y direction is not the same as a position of the centroid C2 of corresponding one of the storing objects 80A in the Y direction. The center C1 of each of the elastic bodies 23 is outside the centroid C2 of corresponding one of the storing objects 80A with respect to the center of the two rows of the storing objects 80A. The phrase that the center C1 of each of the elastic bodies 23 is outside the centroid C2 of corresponding one of the storing objects 80A means that a distance D1 between the centerline CL in the Y direction and the center C1 of each of the elastic bodies 23 is larger than a distance D2 between the centerline CL in the Y direction and the centroid C2 of corresponding one of the storing objects 80A.

As viewed in the row direction (X direction), a distance D in the Y direction (horizontal direction) between the center C1 of each of the elastic bodies 23 and the centroid C2 of corresponding one of the storing objects 80A is in a range from 2% to 8% of the diameter of each of the elastic bodies 23. Supposing that the diameter of each of the elastic bodies 23 is 65 mm, the distance in the horizontal direction between the center of each of the elastic bodies 23 and the centroid of corresponding one of the storing objects 80A is in a range from approximately 1.3 mm to 5.2 mm. When the elastic body 23 is cylindrical, the diameter of the elastic body 23 is the maximum outer diameter of the elastic body 23.

It should be noted that, when the elastic bodies 23 are not in a form of cylinders but are polygonal in a cross section, the distance in the horizontal direction between the center of each of the elastic bodies 23 and the centroid of corresponding one of the storing objects 80A is in a range from 2% to 8% of the maximum outer diameter of the elastic body 23. The maximum outer diameter refers to a diameter of a circumscribed circle of the polygon.

Further, supposing that a gap between a pair of the elastic bodies adjoining in the X direction is Gx and a gap between a pair of the elastic bodies adjoining in the Y direction is Gy, a ratio Gy/Gx of Gy to Gx is in a range from 1 to 1.3.

Optimization of Positions and Number of Elastic Bodies, Bending Strength of Flat Plate, and the Like Next, an analysis, which is made in order to optimize the positions and number of the elastic bodies 23, the bending strength of the flat plates 21 and 22, and the ratio Gy/Gx of the gap Gy between the elastic bodies adjoining in the Y direction to the gap Gx between the elastic bodies adjoining in the X direction, will be described below.

Determining Positions and Number of Elastic Bodies

The inventors supposed that the positions of the elastic bodies 23 affected flexure of the first flat plate 21 and inclination of the storing objects 80A. Especially, since the upper cushioning materials 5 and the middle cushioning materials 3 are separated in the Y direction, supposing that the positions of the elastic bodies 23 in the Y direction greatly affected the flexure of the first flat plate 21 and the inclination of the storing objects 80A, displacement (flexure) of the first flat plate 21 was analyzed while the positions of the elastic bodies 23 were changed in the Y direction.

The positions of the elastic bodies 23 were changed so that the center C1 of each of the elastic bodies 23 was shifted in the Y direction with respect to the centroid C2 of corresponding one of the storing objects 80A. The position of each of the elastic bodies 23 in the X direction was the same as the position of corresponding one of the storing objects 80A in the X direction, and was not changed. The diameter of each of the elastic bodies 23 was 65 mm.

Figure 8:
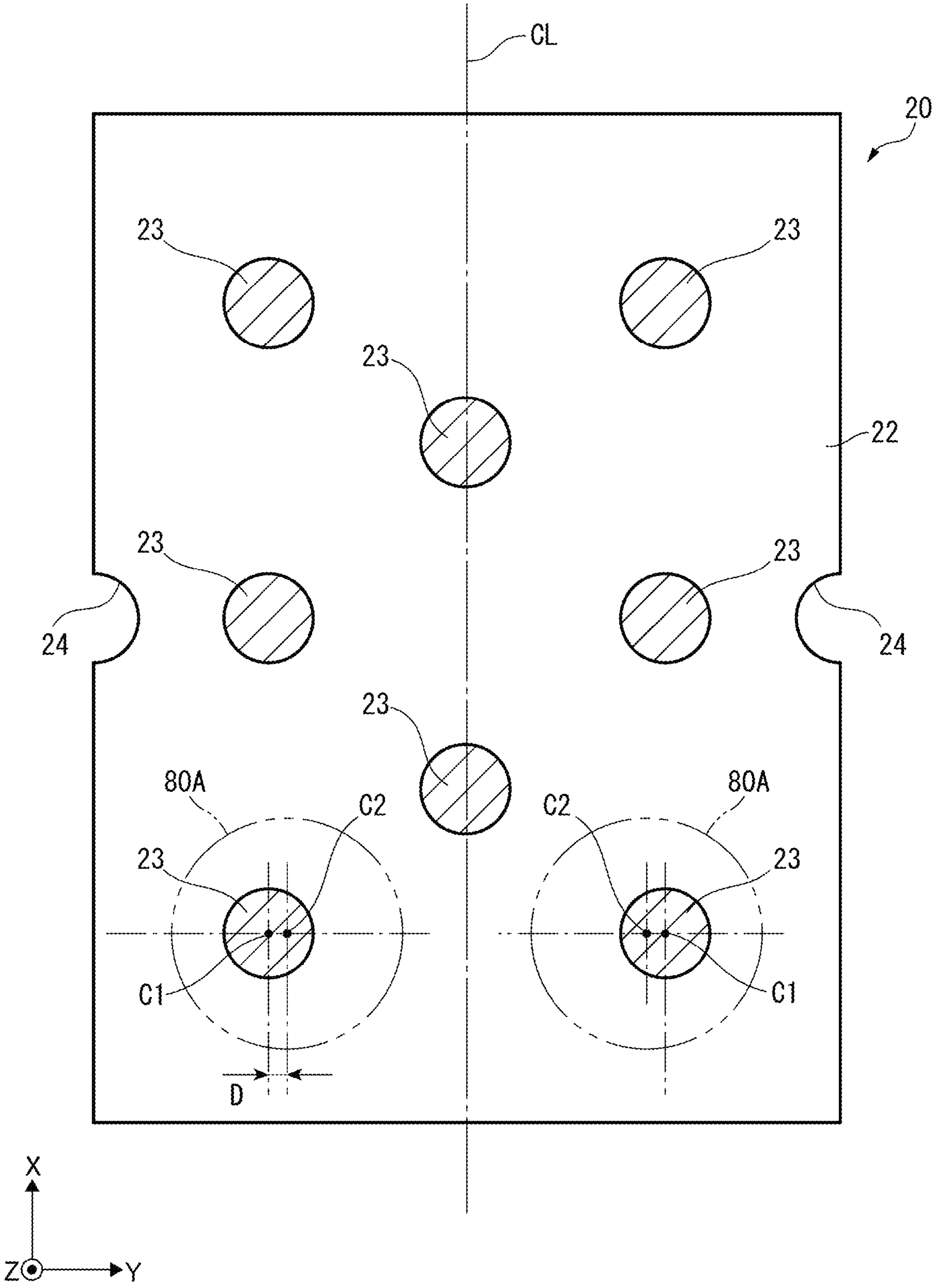
FIG. 8 is a plan view of the vibration absorbing unit including eight elastic bodies according to the exemplary embodiment of the invention.

In addition, in order to determine the suitable number of the elastic bodies 23, two elastic bodies 23 were additionally provided along the centerline CL in the Y direction as illustrated in FIG. 8, and the analysis was made in an instance with eight elastic bodies 23.

Figure 9:
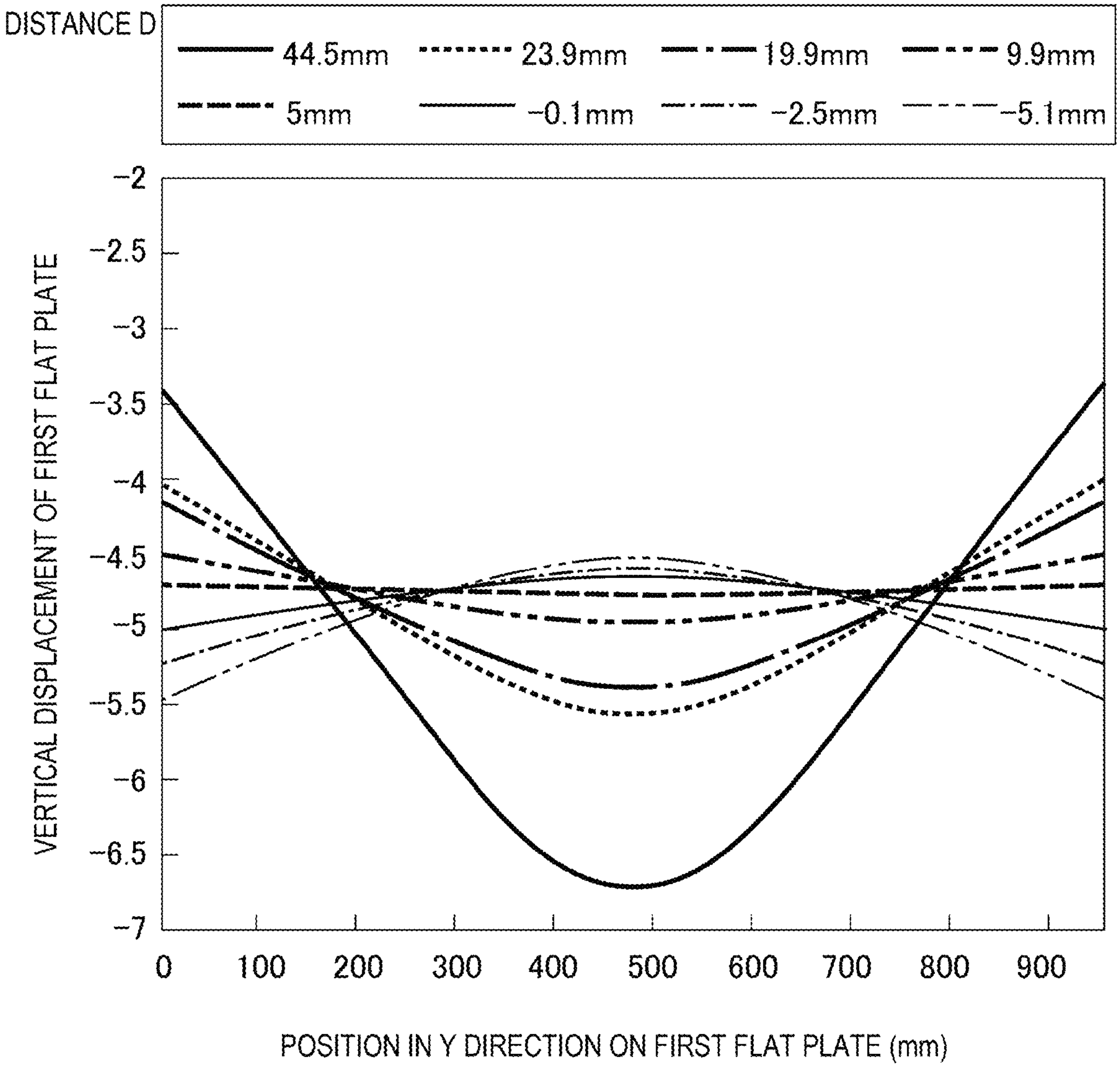
FIG. 9 is a graph illustrating displacement of a first flat plate when the elastic bodies are shifted in a Y direction.

FIG. 9 is a graph illustrating the displacement of the first flat plate 21 when six elastic bodies 23 located as illustrated in FIG. 7 were shifted in the Y direction. The abscissa axis in FIG. 9 represents the position of the first flat plate 21 in the Y direction (mm), and the ordinate axis represents the displacement of the first flat plate 21 in the vertical direction. It should be noted that 0 mm in the Y direction corresponds to an end LS on the left side in FIG. 7 and 950 mm in the Y direction corresponds to an end RS on the right side in FIG. 7.

As illustrated in FIG. 9, the displacement of the first flat plate 21 was minimized when the distance D between the center C1 of each of the elastic bodies 23 and the centroid C2 of corresponding one of the storing objects 80A was 5 mm. In other words, the flexure of the first flat plate 21 was minimized when the center C1 of each of the elastic bodies 23 was located 5 mm outside the centroid C2 of corresponding one of the storing objects 80A.

It is believed that, since the diameter of each of the elastic bodies 23 was 65 mm, each of the elastic bodies 23 was present immediately below the centroid C2 of corresponding one of the storing objects 80A even when the center C1 of each of the elastic bodies 23 was located outside by 5 mm with respect to the centroid C2 of corresponding one of the storing objects 80A, and thus the first flat plate 21 was stably supported.

In contrast, the flexure of the first flat plate 21 was maximized when the distance D was 44.5 mm. It is believed that, since the diameter of each of the elastic bodies 23 was 65 mm, each of the elastic bodies 23 was not present immediately below the centroid C2 of corresponding one of the storing objects 80A, and therefore the first flat plate 21 was easily bent.

Specifically, the flexure of the first flat plate 21 was increased as the distance D was increased from 9.9 mm, to 19.9 mm, 23.9 mm, and 44.5 mm.

Further, in an instance where the center C1 of each of the elastic bodies 23 was situated inward with respect to the centroid C2 of corresponding one of the storing objects 80A, even when the distance D was −0.1 mm, i.e., even when each of the elastic bodies 23 was present immediately below the centroid C2 of corresponding one of the storing objects 80A, more flexure was observed as compared with an instance where the distance D was 5 mm. The flexure was further increased as the distance D was increased to −2.5 mm and −5.1 mm.

Figure 10:
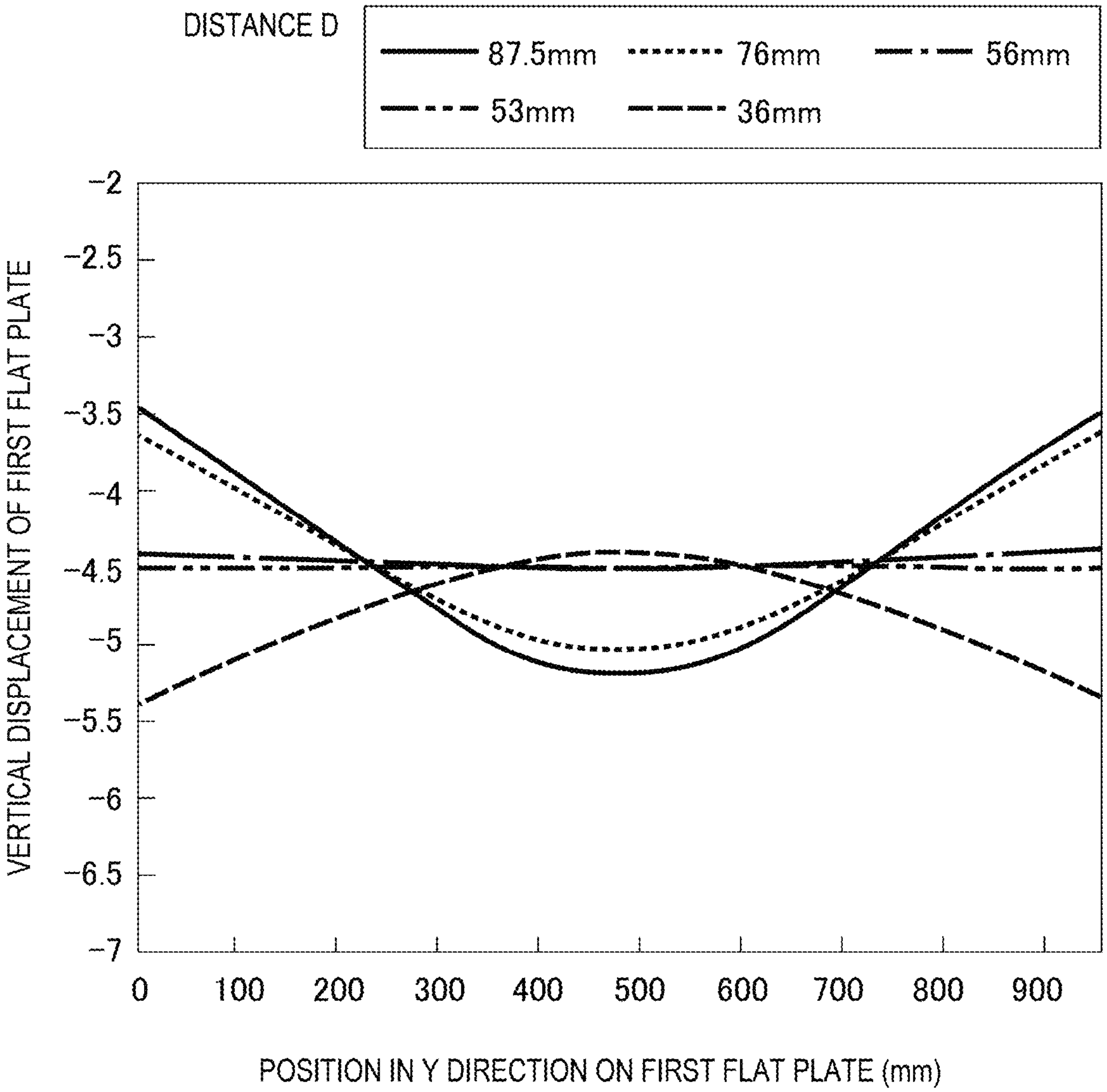
FIG. 10 is a graph illustrating displacement of the first flat plate when the elastic bodies are shifted in the Y direction in an arrangement including eight elastic bodies.

FIG. 10 is a graph illustrating the displacement of the first flat plate 21 when eight elastic bodies 23 located as illustrated in FIG. 8 were shifted in the Y direction. The abscissa axis in FIG. 10 represents the position of the first flat plate 21 in the Y direction (mm), and the ordinate axis represents the displacement of the first flat plate 21 in the vertical direction.

As illustrated in FIG. 10, the displacement of the first flat plate 21 was minimized when the distance D between the center C1 of each of the elastic bodies 23 and the centroid C2 of corresponding one of the storing objects 80A was 53 mm. It is believed that the first flat plate 21 was not easily bent because of the two elastic bodies 23 located on the centerline CL in the Y direction even when each of the elastic bodies 23 was not present immediately below the centroid C2 of corresponding one of the storing objects 80A.

As a result of the above analysis, it was found that the distance D between the center C1 of each of the elastic bodies 23 and the centroid C2 of corresponding one of the storing objects 80A was most suitably 5 mm when the number of the elastic bodies 23 was six and was most suitably 53 mm when the number of the elastic bodies 23 was eight.

Next, in order to determine the number of the elastic bodies 23, the container 200 installed with the storing objects 80A and the packaging unit 10 was fixed on a vibration test machine and vibration sensors were attached to predetermined points on the storage cases, palette, and vibration table to perform vibration tests. The vibration frequency was in a range from 5 to 500 Hz, vibration condition was 0.5 G, and vibration time was 5 minutes.

Figure 11:
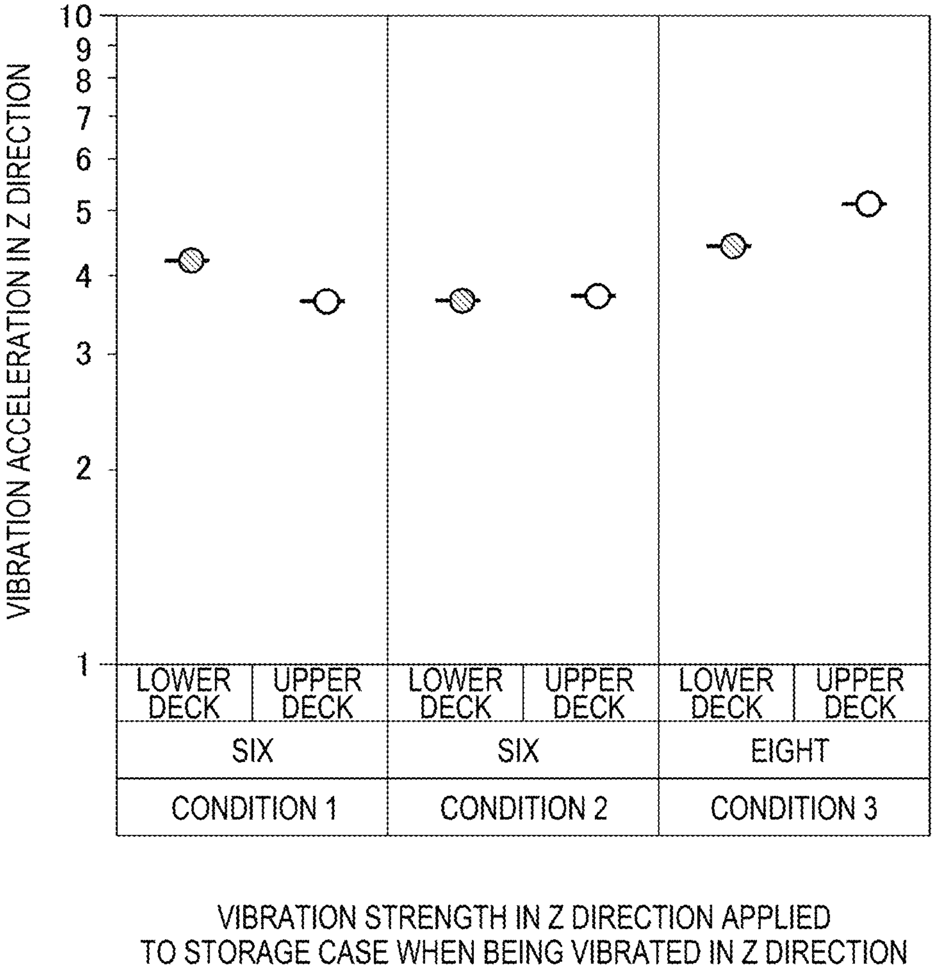
FIG. 11 is a graph illustrating results of a vibration test.

FIG. 11 is a graph illustrating results of the vibration tests, which were conducted under a condition 1 (the number of elastic bodies 23: six, the distance D: 44.5 mm), a condition 2 (the number of elastic bodies 23: six, the distance D: 5 mm), and a condition 3 (the number of elastic bodies 23: eight, the distance D: 53 mm). In the vibration tests, vibration was applied in the Z direction and vibration strengths applied to the storage cases in the Z direction were compared. The "LOWER DECK" and "UPPER DECK" in FIG. 11 represent the vibration strengths detected at the storage case in the lower deck and the storage case in the upper deck, respectively.

As illustrated in FIG. 11, when the number of the installed elastic bodies 23 was eight, it was found that the vibration acceleration in the Z direction was increased even when the elastic bodies 23 were placed so that the displacement of the first flat plate 21 could be reduced. It is believed that this is because, as the number of the elastic bodies 23 increases, vibration absorptivity is lowered due to excessively increased rigidity of the vibration absorbing unit 20 in the entirety thereof. As a result, it was concluded that the number of the elastic bodies was preferably six.

Incidentally, it was found that, though the displacement was large under the condition 1 in the graph in FIG. 9 illustrating the displacement of the first flat plate 21, the vibration acceleration in the Z direction was not greatly affected by the large displacement, but was greatly affected by the number of elastic bodies.

Figure 12:
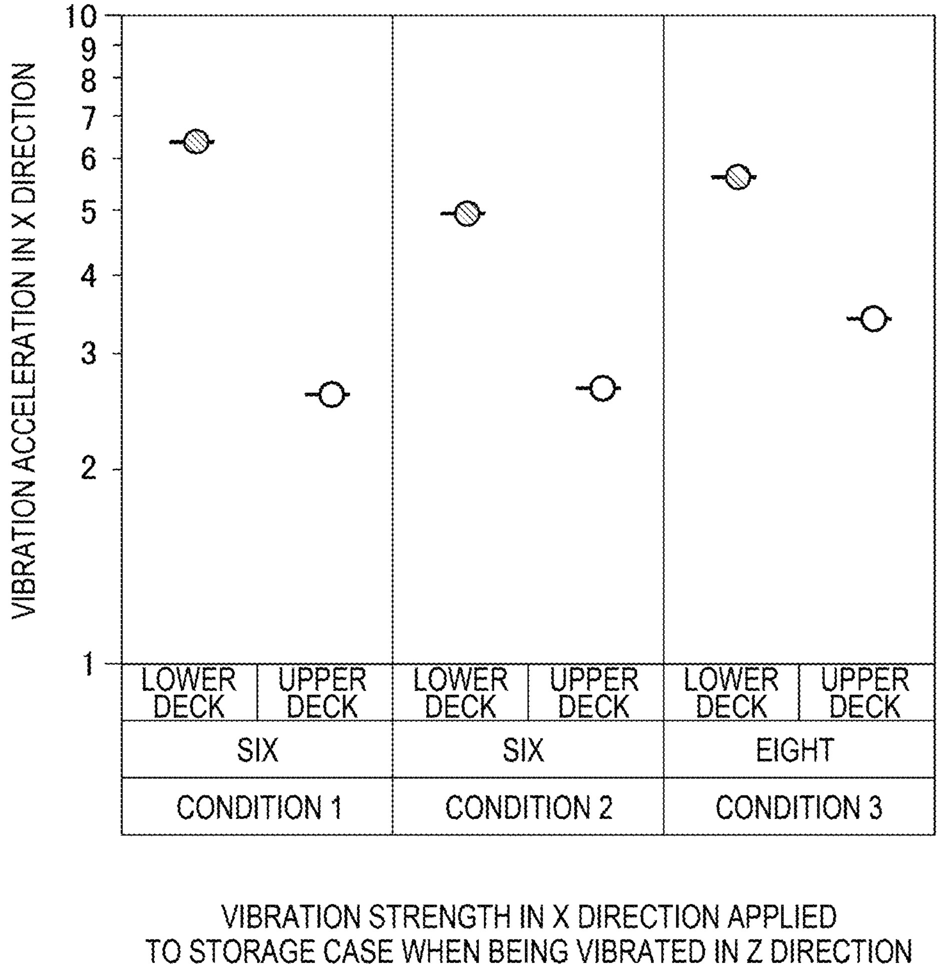
FIG. 12 is a graph illustrating results of another vibration test.

FIG. 12 is a graph illustrating results of the vibration tests under the conditions 1, 2 and 3, where vibration was applied in the Z direction and vibration strengths applied to the storage case in the X direction were compared.

As illustrated in FIG. 12, when the number of the installed elastic bodies 23 was eight, it was found that the vibration acceleration in the X direction, especially, in the upper deck was increased even when the elastic bodies 23 were installed so that the displacement of the first flat plate 21 could be reduced. It is also believed that this is because, as the number of the elastic bodies 23 increases, vibration absorptivity is lowered due to excessively increased rigidity of the vibration absorbing unit 20 in the entirety thereof. Also in view of the above results, it was concluded that the number of the elastic bodies was preferably six.

It was also found that the vibration acceleration in the X direction was not greatly affected under the condition 1, but was greatly affected by the number of the elastic bodies.

When the number of the installed elastic bodies 23 is six, a ratio of the distance D to the diameter of the elastic body 23 is most suitably 8% (~5 mm/65 mm), which is defined as an upper limit value. As can be understood from FIG. 9, the flexure is increased when the distance D is 9.9 mm, and therefore the upper limit value is defined in order to prevent the increase.

In contrast, a lower limit of the distance D is defined to be 2% of the diameter of the elastic body 23. Since the position of the center C1 of each of the elastic bodies 23 is preferably outside the position of the centroid C2 of corresponding one of the storing objects 80A, the lower limit is defined as above to prevent the position of the center C1 of each of the elastic bodies 23 from being placed inward with respect to the position of the centroid C2 of corresponding one of the storing objects 80A due to manufacturing error. As can be understood from FIG. 9, the flexure is increased when the distance D is −0.1 mm, and therefore the lower limit value is defined in order to prevent the increase.

Determining Bending Strength of Flat Plate

Next, in order to determine the strength of the flat plate, vibration tests were conducted using two types of the first flat plates 21 with different bending strengths.

Figure 13:
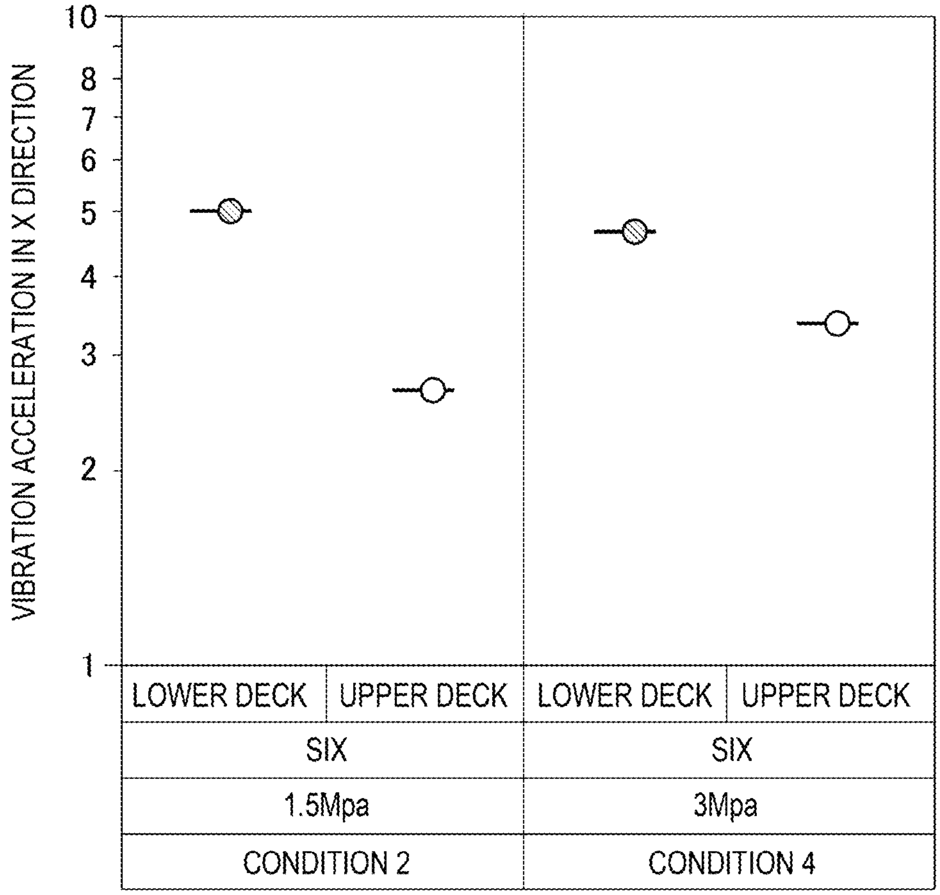
FIG. 13 is a graph illustrating results of still another vibration test.

FIG. 13 is a graph illustrating results of the vibration tests, which were conducted under the condition 2 (the number of elastic bodies 23: six, the distance D: 5 mm, the bending strength of the first flat plate: 1.5 MPa (the same bending strength as that of the second flat plate)) and a condition 4 (the number of elastic bodies 23: six, the distance D: 5 mm, the bending strength of the first flat plate: 3 MPa (twice as large as the bending strength of the second flat plate)). In the vibration tests, vibration was applied in the Z direction and vibration strengths applied to the storage cases in the X direction were compared.

As illustrated in FIG. 13, when the bending strength of the first flat plate was twice as large as the bending strength of the second flat plate, though the vibration strength in the upper deck was slightly increased, the flexure could be improved while improving the vibration strength in the lower deck. As a result, it was concluded that the bending strength of the first flat plate 21 was preferably twice as large as the bending strength of the second flat plate.

Optimization of Ratio Gy/Gx of Gap Gy Between Elastic Bodies Adjoining in Y Direction to Gap Gx Between Elastic Bodies Adjoining in X Direction A vibration analysis model was constructed for the container, the packaging unit, the storing objects, and the palette supporting these components from below, and a frequency response analysis was performed using a finite element analysis software, in order to optimize the ratio Gy/Gx of the gap Gy between the elastic bodies adjoining in the Y direction to the gap Gx between the elastic bodies adjoining in the X direction.

Specifically, in the frequency response analysis, a sine-wave acceleration of an amplitude of ±0.5 G was applied on the palette supporting the container from below to evaluate response of the respective components against the external vibration by calculating the acceleration. The frequency was in a range from 10 Hz to 200 Hz, and was incremented by 1 Hz.

The evaluation was made based on an effective value of RMS (Root Mean Square) calculated by a formula (1) below.

$$\text{RMS} = \sqrt{\text{(average of sum of squares of acceleration at each of frequencies)}} \quad (1)$$

In other words, RMS is the root mean square of the acceleration at each of the frequencies.

It has been found that the amount of resin attached to an end of a wafer caused by vibration during transportation correlates to RMS, based on the results of analysis of past vibration test for the storing objects.

Figure 14:
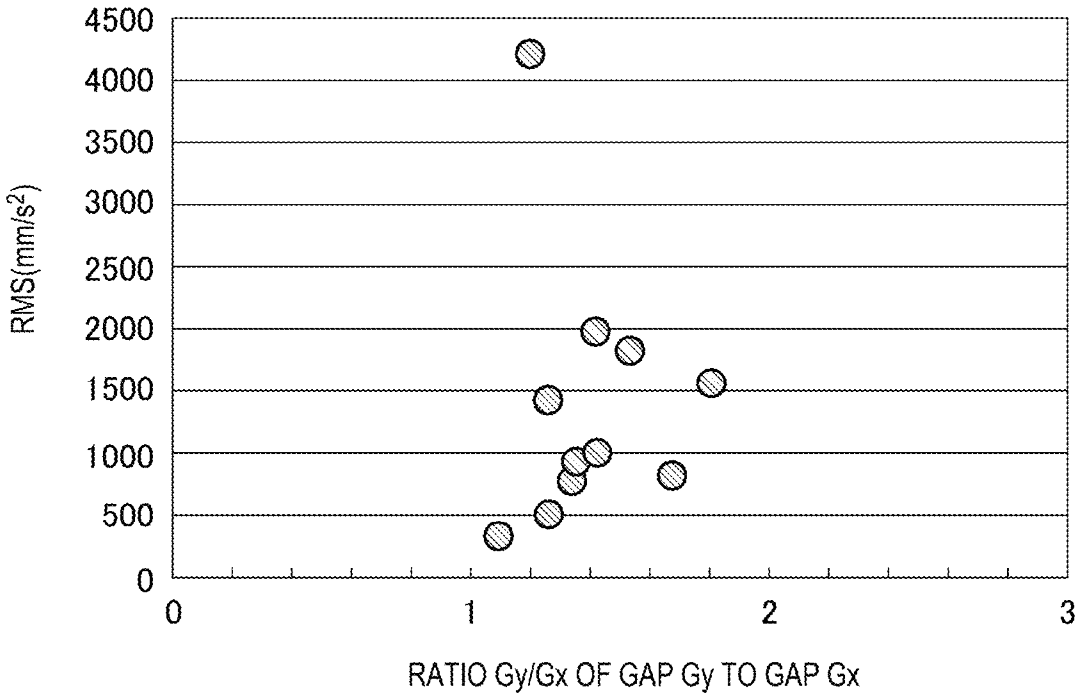
FIG. 14 is a graph illustrating a correlation between a ratio Gy/Gx and RMS.

FIG. 14 is a graph illustrating a correlation between the ratio Gy/Gx and RMS. As illustrated in FIG. 14, it was found that RMS tended to become small at the ratio Gy/Gx being in a range from 1 to 1.3.

According to the above exemplary embodiment, the flexure of the first flat plate 21 can be reduced by defining the distance D between the center C1 of each of the elastic bodies 23 and the centroid C2 of corresponding one of the storing objects 80A in a range from 2% to 8% of the diameter of each of the elastic bodies 23. Thus, in the packaging unit 10 used for packing the storing objects 80A in the container 200, the inclination of the storing objects 80A can be restrained and the storing objects 80A and the cushioning materials can be stably taken out.

Further, supposing that the gap between the elastic bodies adjoining in the X direction is Gx and the gap between the elastic bodies adjoining in the Y direction is Gy, the ratio Gy/Gx of Gy to Gx is defined in a range from 1 to 1.3. Accordingly, the vibration applied to the storing objects 80A during, for instance, transportation can be restrained to reduce the amount of the resin attached to ends of wafers.

Further, by defining the bending strength of the first flat plate 21 at a value twice to thrice as large as the bending strength of the second flat plate 22, the vibration strength when being applied with vibration can be reduced.

In addition, since the first flat plate 21 and the second flat plate 22 are provided with the cuts 24, the vibration absorbing unit 20 can be taken out with the use of the cuts 24. The vibration absorbing unit 20 can thus be easily taken out.

It should be noted that the elastic bodies 23 are cylindrical in the above exemplary embodiment but are not necessarily cylindrical. For instance, the elastic bodies may be prismatic in shape such as rectangular parallelepiped, or may have a frustum shape.

Although the position of each of the elastic bodies 23 in the X direction and the position of the centroid C2 of corresponding one of the storing objects 80A in the X direction are substantially the same (i.e. aligned) in the above exemplary embodiment, the positions are not necessarily aligned and may be offset in the X direction. However, the elastic bodies 23 at the center in the X direction are preferably substantially aligned in the X direction with the centroids C2 of corresponding ones of the storing objects 80A.

Further, though the bending strength of the first flat plate 21 is twice to thrice as large as the bending strength of the second flat plate 22 in the above exemplary embodiment, the bending strength is not necessarily set as in the exemplary embodiment. For instance, the bending strength of the first flat plate 21 may be the same as the bending strength of the second flat plate 22 as long as the flexure of the first flat plate 21 can be restrained by optimizing the positions of the elastic bodies 23.

Although the lower cushioning material is an integral component in the above exemplary embodiment, the lower cushioning material may be separable in the width direction as in the upper cushioning materials and the middle cushioning materials.

The middle cushioning materials may be components separable in the vertical direction.

The invention claimed is:

1. A packaging unit that packs storing objects into a box-shaped container, the storing objects being cases storing semiconductor wafers and being arranged in two rows spaced from each other in a width direction and in double deck in a vertical direction in the container, the packaging unit comprising:

a lower cushioning material configured to support lower parts of the storing objects in the two rows in a lower deck;

middle cushioning materials, each one of the middle cushioning materials being interposed between the storing objects in corresponding one of the two rows in an upper deck and the storing objects in corresponding one of the two rows in the lower deck;

upper cushioning materials, each one of the upper cushioning materials being provided on the storing objects in corresponding one of the two rows in the upper deck and configured to hold upper parts of the storing objects in the corresponding one of the two rows; and a vibration absorbing unit provided on a bottommost portion of the container, the vibration absorbing unit being configured to support the lower cushioning material from below, wherein the vibration absorbing unit comprises:

a first flat plate;

a second flat plate provided below the first flat plate to be parallel to the first flat plate; and elastic bodies interposed between the first flat plate and the second flat plate, the number of the elastic bodies being the same as the number of the storing objects in each of the decks, and wherein:

the elastic bodies are provided in positions corresponding to the storing objects arranged in the box-shaped container, each elastic body is arranged at a planar position corresponding to a respective one of the storing objects, a center of each elastic body is positioned substantially at a center position of the corresponding storing object in a row direction, and wherein the center of each elastic body is displaced outward from a center position of the corresponding storing object in a width direction with respect to a centerline between the two rows and a distance between the center of each of the elastic bodies and a centroid of the corresponding one of the storing objects in the width direction is in a range from 2% to 8% of a maximum outer diameter of each of the elastic bodies.

2. The packaging unit according to claim 1, wherein a ratio Gy/Gx of Gy to Gx is in a range from 1 to 1.3, where Gx is a gap between centers of the elastic bodies adjoining in a row direction and Gy is a gap between centers of the elastic bodies adjoining in a width direction.

3. The packaging unit according to claim 1, wherein a bending strength of the first flat plate is twice to thrice as large as a bending strength of the second flat plate.

4. The packaging unit according to claim 1, wherein a cut is formed at least in the first flat plate, of the first flat plate and the second flat plate.

5. The packaging unit according to claim 1, wherein the distance between the center of each elastic body and the centroid of the corresponding storing object in the width direction is approximately 5 mm.

6. The packaging unit according to claim 1, wherein the number of elastic bodies is six.

7. The packaging unit according to claim 1, wherein the elastic bodies have a cylindrical shape with a diameter of 45 mm to 85 mm and a height of 25 mm to 35 mm.

8. The packaging unit according to claim 1, wherein the elastic bodies are bonded to the first flat plate and the second flat plate.

9. A transportation container comprising:

the packaging unit according to claim 1; and a box-shaped container configured to house the packaging unit.

* * * * *